US009520302B2

(12) United States Patent
Ko et al.

(10) Patent No.: US 9,520,302 B2
(45) Date of Patent: Dec. 13, 2016

(54) METHODS FOR CONTROLLING FIN RECESS LOADING

(71) Applicant: APPLIED MATERIALS, INC., Santa Clara, CA (US)

(72) Inventors: Jungmin Ko, San Jose, CA (US); Sean Kang, San Ramond, CA (US); Kwang-Soo Kim, Santa Clara, CA (US); Olivier Luere, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/934,547

(22) Filed: Nov. 6, 2015

(65) Prior Publication Data

US 2016/0133459 A1    May 12, 2016

Related U.S. Application Data

(60) Provisional application No. 62/077,062, filed on Nov. 7, 2014.

(51) Int. Cl.
*H01L 21/311*    (2006.01)
(52) U.S. Cl.
CPC ................................ *H01L 21/31116* (2013.01)
(58) Field of Classification Search
CPC .. H01L 21/164; H01L 21/845; H01L 21/3212; H01L 21/762; H01L 21/823431; H01L 21/3211; H01L 21/32136; H01L 21/02642; H01L 21/02219; H01L 21/02252; H01L 21/02123; H01L 21/02249; H01L 27/10879

USPC ....... 438/197, 692, 700, 668, 729, 770, 772; 257/E21.006, E21.014, E21.077, E21.084, 257/E21.304, E21.311, E21.545, E21.577
See application file for complete search history.

(56) References Cited

U.S. PATENT DOCUMENTS

| 8,133,817 B2* | 3/2012 | Sasano ................ H01L 21/3065 |
| | | 438/714 |
| 8,435,904 B2* | 5/2013 | Sinha ................ H01L 21/31116 |
| | | 438/750 |
| 9,064,812 B2* | 6/2015 | Kim .................... H01L 21/3065 |
| 2011/0223755 A1 | 9/2011 | Kao et al. |
| 2015/0111389 A1* | 4/2015 | He .................... H01L 21/31116 |
| | | 438/723 |

OTHER PUBLICATIONS

U.S. Appl. No. 14/535,055, Nov. 6, 2015, Ko et al.

* cited by examiner

*Primary Examiner* — David Nhu
(74) *Attorney, Agent, or Firm* — Moser Taboada; Alan Taboada

(57) ABSTRACT

A method of processing a substrate includes depositing an oxide material on a substrate having a first region, a second region and a plurality of features, wherein the first region has a high feature density and the second region has a low feature density; and controlling a ratio of an etch rate of the oxide material in the first region to an etch rate of the oxide material in the second region by forming an ammonium hexafluorosilicate ($(NH_4)_2SiF_6$) layer having a first thickness atop the oxide material in the first region and having a second thickness atop the oxide material in the second region.

19 Claims, 3 Drawing Sheets

METHODS FOR CONTROLLING FIN RECESS LOADING

CROSS-REFERENCE TO RELATED APPLICATIONS

This application claims benefit of U.S. provisional patent application Ser. No. 62/077,062, filed Nov. 7, 2014, which is herein incorporated by reference in its entirety.

FIELD

Embodiments of the present disclosure generally relate to semiconductor substrate processing, and more specifically, to methods of controlling fin recess loading.

BACKGROUND

Typical process flows that are performed to form FinFET devices involve forming a plurality of features in a substrate to define the areas where shallow trench isolation (STI) regions will be formed and to define the initial structure of the fins. The features have a target depth that is sufficient for the fin height and deep enough to allow formation of an effective STI region. After the features are formed, a layer of insulating material, such as silicon dioxide, is formed so as to overfill the features. Thereafter, a chemical mechanical polishing (CMP) process is then performed to planarize the upper surface of the insulating material with the top of the fins (or the top of a patterned hard mask). Thereafter, an etch-back process is performed to recess the layer of insulating material between the fins and expose the upper portions of the fins, which corresponds to the final fin height of the fins.

One challenge of fabricating, or etching, the insulating material between the fins is micro-loading between regions of dense features and regions of isolated features. Micro-loading manifests itself as differences in feature profile and etch depth between regions of high feature density and regions of low feature density. For example, regions of low feature density may etch to a depth that is different than an etch depth corresponding to the regions of high feature density. For example, in some cases regions having isolated features may be etched faster (i.e. forward micro-loading) or slower (i.e. reverse micro-loading) than regions having high feature density.

Accordingly, the inventors have provided improved methods of controlling fin recess loading.

SUMMARY

Embodiments of methods for controlling fin recess loading are described herein. In some embodiments, a method of processing a substrate includes depositing an oxide material on a substrate having a first region, a second region and a plurality of features, wherein the first region has a high feature density and the second region has a low feature density; and controlling a ratio of an etch rate of the oxide material in the first region to an etch rate of the oxide material in the second region by forming an ammonium hexafluorosilicate (($NH_4)_2SiF_6$) layer having a first thickness atop the oxide material in the first region and having a second thickness atop the oxide material in the second region.

In some embodiments, a method of processing a substrate includes; depositing an oxide material on a substrate having a first region, a second region and a plurality of features, wherein the first region has a high feature density and the second region has a low feature density; controlling a ratio of an etch rate of the oxide material in the first region to an etch rate of the oxide material in the second region by forming an ammonium hexafluorosilicate (($NH_4)_2SiF_6$) layer having a first thickness atop the oxide material in the first region and having a second thickness atop the oxide material in the second region, wherein the first thickness is different than the second thickness; and heating the substrate to a second temperature to sublimate the ammonium hexafluorosilicate (($NH_4)_2SiF_6$) layer.

In some embodiments, a computer readable medium is provided having instructions stored thereon that, when executed, causes a process chamber to perform a method for processing a substrate. The method may include any of the methods disclosed herein.

Other and further embodiments of the present disclosure are described below.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. However, the appended drawings illustrate only typical embodiments of the disclosure and are therefore not to be considered limiting of scope, for the disclosure may admit to other equally effective embodiments.

Figure 1:
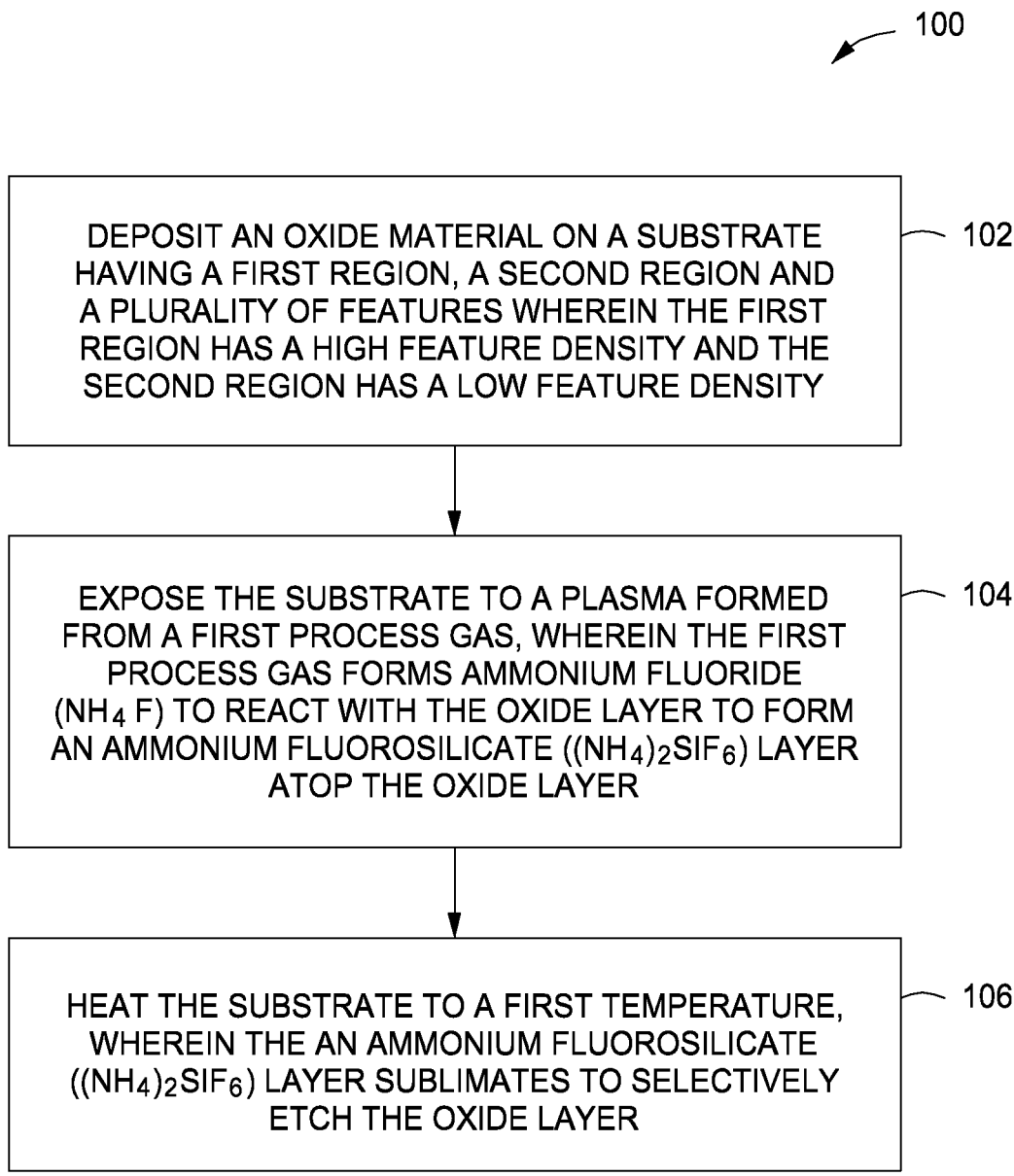
FIG. 1 is a flow diagram of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide methods for controlling fin recess loading that may advantageously provide uniform depth around fin structures, without the formation of dummy fins.

FIG. 1 is a flow diagram of a method 100 for processing a substrate in accordance with some embodiments of the present disclosure. The method of FIG. 1 is described with reference to FIGS. 2A-2D where appropriate.

Figure 2A:
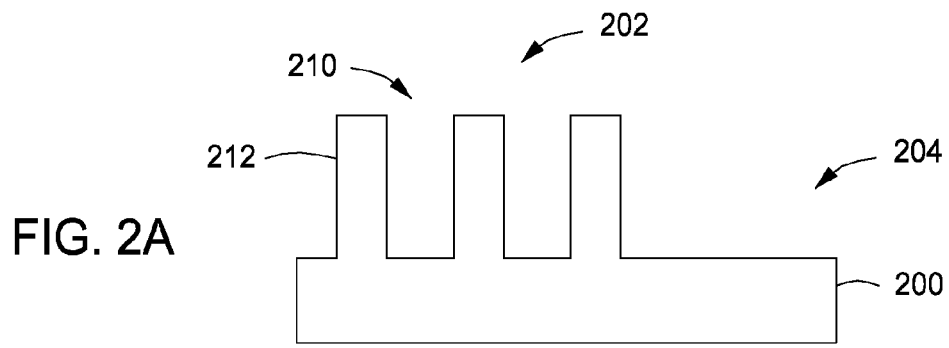
FIGS. 2A-2D respectively depict the stages of fabrication of forming a shallow trench isolation structure in a silicon germanium layer accordance with some embodiments of the present disclosure.

The method 100 is performed on a substrate 200 as depicted in FIG. 2A. In some embodiments, the substrate 200 may be any substrate suitable for forming a FinFET device. In some embodiments for example, the substrate 200 is silicon. The substrate 200 has a first region 202, a second region 204, and a plurality of features 210. The plurality of features 210 are defined by a plurality of fins 212. The first region 202 has a high feature density. The second region 204 has a low feature density.

The plurality of features 210 may be formed by performing at least one etching process through a patterned hard mask layer (not shown), e.g., a patterned layer of silicon nitride. The etching process results in the formation of a plurality of spaced-apart fins 212. The features 210 may have any suitable dimensions (i.e. depth and width) for fabricating a FinFET structure. In some embodiments, the features 210 may have a depth of about 40 nm to about 60 nm. In some embodiments, the features may have a width of about 20 nm to about 30 nm. In some embodiments, the fins 212 may have a width of about 10 nm to about 12 nm. Thereafter, the patterned masking layer is removed.

Figure 2B:
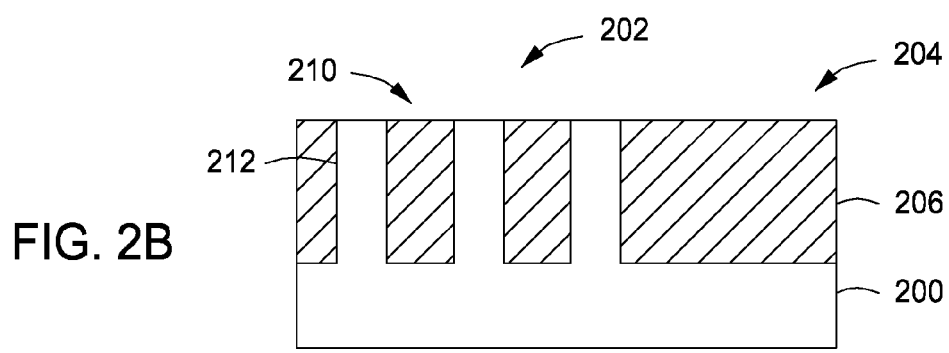

The method 100 begins at 102 where a layer of oxide material 206, such as silicon oxide ($SiO_x$)(where x is a positive integer), is deposited on the substrate 200 so as to over-fill the features 210. In some embodiments, the oxide material is silicon dioxide ($SiO_2$). As depicted in FIG. 2B, a chemical mechanical polishing (CMP) process is then performed so as to planarize the upper surface of the layer of oxide material 206 with the upper surface of the fins 212.

Next, at 104, a ratio of the etch rate of the oxide material 206 in the first region 202 to the etch rate of the oxide material 206 in the second region 204 is controlled by forming an ammonium hexafluorosilicate (($NH_4)_2SiF_6$) layer 208 (also referred to herein and in the Figures as ammonium fluorosilicate) having a first thickness atop the oxide material 206 in the first region 202 and having a second thickness atop the oxide material 206 in the second region 204.

The ammonium hexafluorosilicate (($NH_4)_2SiF_6$) layer 208 is formed by exposing the substrate 200 to a plasma formed from a first process gas. The first process gas comprises ammonia ($NH_3$) and nitrogen trifluoride ($NF_3$), which react to form ammonium fluoride ($NH_4F$) gas. In some embodiments, the substrate is exposed to the plasma formed from the first process gas for about 30 to about 60 seconds. Not wishing to be bound by theory, the inventors believe that the ammonium fluoride ($NH_4F$) gas reacts with the layer of oxide material 206 to selectively etch the oxide material 206 and form ammonium hexafluorosilicate (($NH_4)_2\ SiF_6$), and water vapor ($H_2O$) by-products. The $H_2O$ vapors are evacuated from the processing chamber, leaving a thin film of ammonium hexafluorosilicate (($NH_4)_2 SiF_6$) behind on the surface of the oxide material 206. In some embodiments, the substrate 200 is maintained at a first temperature of less than about 50 degrees Celsius to promote reaction of the ammonium fluoride ($NH_4F$) with the oxide material 206.

Next, at 106, the substrate 200 is heated to a second temperature at which the ammonium hexafluorosilicate (($NH_4)_2SiF_6$) layer 208 dissociates or sublimates to selectively etch the oxide material 206. The second temperature may be any temperature sufficient to dissociate or sublimate the ammonium hexafluorosilicate (($NH_4)_2SiF_6$) layer 208 into volatile $SiF_4$, $NH_3$, and HF products. The second temperature may be constrained by hardware limitations, materials limitations, and/or application limitations (e.g., thermal budget or maximum temperature limits to prevent device or structure damage). In some embodiments, the substrate 200 is heated to a second temperature of about 100 to about 150 degrees Celsius, or in some embodiments greater than about 100 degrees Celsius, to vaporize the reacted ammonium hexafluorosilicate (($NH_4)_2SiF_6$) layer 208.

104-106 can be performed for any suitable number of cycles to etch the oxide material 206 to a predetermined thickness. The inventors have observed that by controlling the amount of ammonium hexafluorosilicate (($NH_4)_2SiF_6$) layer 208 generated during each cycle the loading of the substrate can be controlled, if the sublimation time is constant. In some embodiments, the sublimation process occurs for about 60 seconds.

Figure 2C:
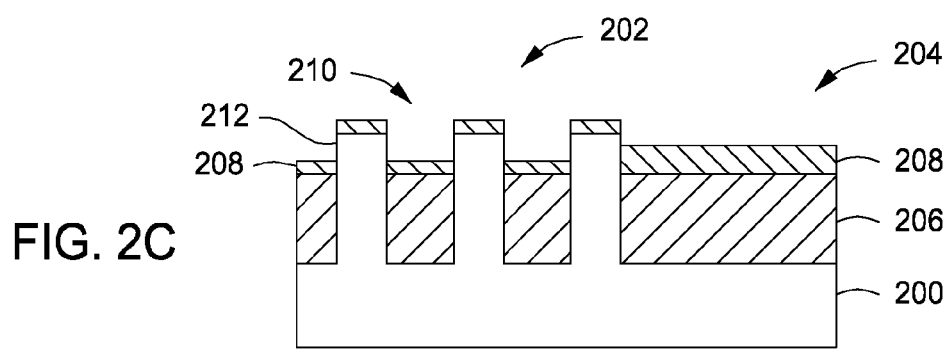

For example, in some embodiments, as depicted in FIG. 2C, the ammonium hexafluorosilicate (($NH_4)_2SiF_6$) layer 208 has a first thickness in the first region 202 which is less than the second thickness of the ammonium hexafluorosilicate (($NH_4)_2SiF_6$) layer 208 in the second region 204. The inventors have observed that the relatively thicker amount of ammonium hexafluorosilicate (($NH_4)_2SiF_6$) layer 208 in the second region 204 can slow down subsequent etching at the second region 204 because the ammonium fluoride ($NH_4F$) cannot reach the oxide material directly, having instead to diffuse through the ammonium hexafluorosilicate (($NH_4)_2 SiF_6$) layer 208. Meanwhile the etch depth at the first region 202 increases due to a relatively less ammonium hexafluorosilicate (($NH4)2SiF6$) desorption and redeposition on the oxide surface. As a result, the etch rate of the oxide material 206 in the first region 202 is greater than the etch rate of the oxide material 206 in the second region 204 (i.e. reverse micro-loading).

Figure 2D:
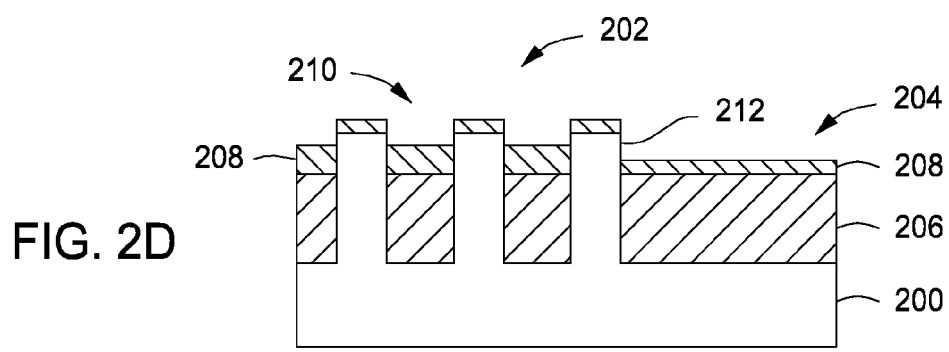

In some embodiments, as depicted in FIG. 2D, the first thickness of the ammonium hexafluorosilicate (($NH_4)_2SiF_6$) layer 208 in the first region 202 is greater than the second thickness of the ammonium hexafluorosilicate (($NH_4)_2SiF_6$) layer 208 in the second region 204. As a result, the oxide material 206 in the second region 204 is etched faster than the oxide material 206 in the first region 202 (i.e. forward loading).

In some embodiments, the first process gas may be provided to the process chamber at any suitable flow rate to form the ammonium fluoride ($NH_4F$) gas. The amount of each gas introduced into the processing chamber is variable and may be adjusted to accommodate, for example, the thickness of the oxide material 206 to be removed. For example, in some embodiments, the first process gas may be provided at a total flow rate of about 30 sccm to about 300 sccm, for example about 150 sccm. In some embodiments, the ratio of ammonia ($NH_3$) to nitrogen trifluoride ($NF_3$) in the first process gas is about 1:1 to about 100:1, for example about 2:1. The combination of ammonia ($NH_3$) and nitrogen trifluoride ($NF_3$) advantageously removes the layer of oxide material 206 with selectivity over the silicon material of the fins 212. In addition, increasing the amount of nitrogen trifluoride in the first process gas can advantageously increase the etch rate of the oxide material 206 to be removed.

In some embodiments, the first process gas further comprises an inert gas, such as one of argon, helium, xenon, krypton, or the like, or a combination thereof. In some embodiments, the inert gas is provided at flow rate of about 600 sccm to about 1200 sccm. The inventors have observed that controlling the ratio of inert gas to reactant gases (i.e. ammonia and nitrogen trifluoride) advantageously controls the formation of the ammonium hexafluorosilicate (($NH_4)_2 SiF_6$). The inventors have further observed that the lower the amount of reactant gas in the first process gas, the greater the etch rate of the oxide material 206 in the second region 204 than the etch rate of the oxide material 206 in the first region 202 (i.e., forward loading). For example, in some embodiments, the ratio of the inert gas to the reactant gases (i.e., ammonia and nitrogen trifluoride) in the first process gas is about 3:1 to about 6:1. At a ratio of about 3:1, the amount of ammonium hexafluorosilicate (($NH_4)_2SiF_6$) formed in the second region 204 is thicker than in the first region 202, resulting in reverse micro-loading; while at a ratio of about 6:1 the amount of ammonium hexafluorosilicate (($NH_4$)$_2$$SiF_6$) formed in the second region 204 is thinner than that in the first region 202, resulting in forward micro-loading. Thus, the process can be advantageously controlled to provide forward or reverse micro-loading.

In some embodiments, the first process gas is ignited in the process chamber, for example the plasma process chamber 300 described below, to form a plasma. In some embodiments, the first process gas may be ignited into a plasma by coupling radio frequency (RF) power at a suitable frequency to the first process gas within a process chamber under suitable conditions to establish the plasma. The plasma energy dissociates the ammonia and nitrogen trifluoride gases into reactive species that combine to form a highly reactive ammonia fluoride ($NH_4F$) compound. The inventors have observed that at a higher source power, for example greater than about 45 watts, the etch rate of the oxide material 206 in the first region 202 is greater than the etch rate of the oxide material 206 in the second region 204 (i.e. reverse micro-loading); while at a lower source power, for example less than about 45 watts, the etch rate of the oxide material 206 in the second region 204 is greater than the etch rate of the oxide material 206 in the first region 202 (i.e. forward loading) The inventors have observed that the greater the pressure the greater the amount of ammonium hexafluorosilicate (($NH_4$)$_2$$SiF_6$) formed in the second region 204 than in the first region 202, resulting in reverse micro-loading; while a lower pressure results in forward micro-loading. In some embodiments, the process chamber may be maintained at a pressure of between about 1 to about 5 torr. The inventors have observed that at higher pressures, for example greater than about 3 torr, the etch rate of the oxide material 206 in the first region 202 is greater than the etch rate of the oxide material 206 in the second region 204 (i.e. reverse micro-loading), while at lower pressures, for example less than about 3 torr, the etch rate of the oxide material 206 in the second region 204 is greater than the etch rate of the oxide material 206 in the first region 202 (i.e. forward loading). Additional process parameters may be utilized to promote plasma ignition and stability. For example, in some embodiments, the process chamber may be maintained at a temperature of between about 30 to about 85 degrees Celsius during plasma ignition.

Once the layer of oxide material 206 is etched to a predetermined depth the method 100 generally ends and the substrate 200 may continue to be processed to complete the FinFET structure.

Figure 3:
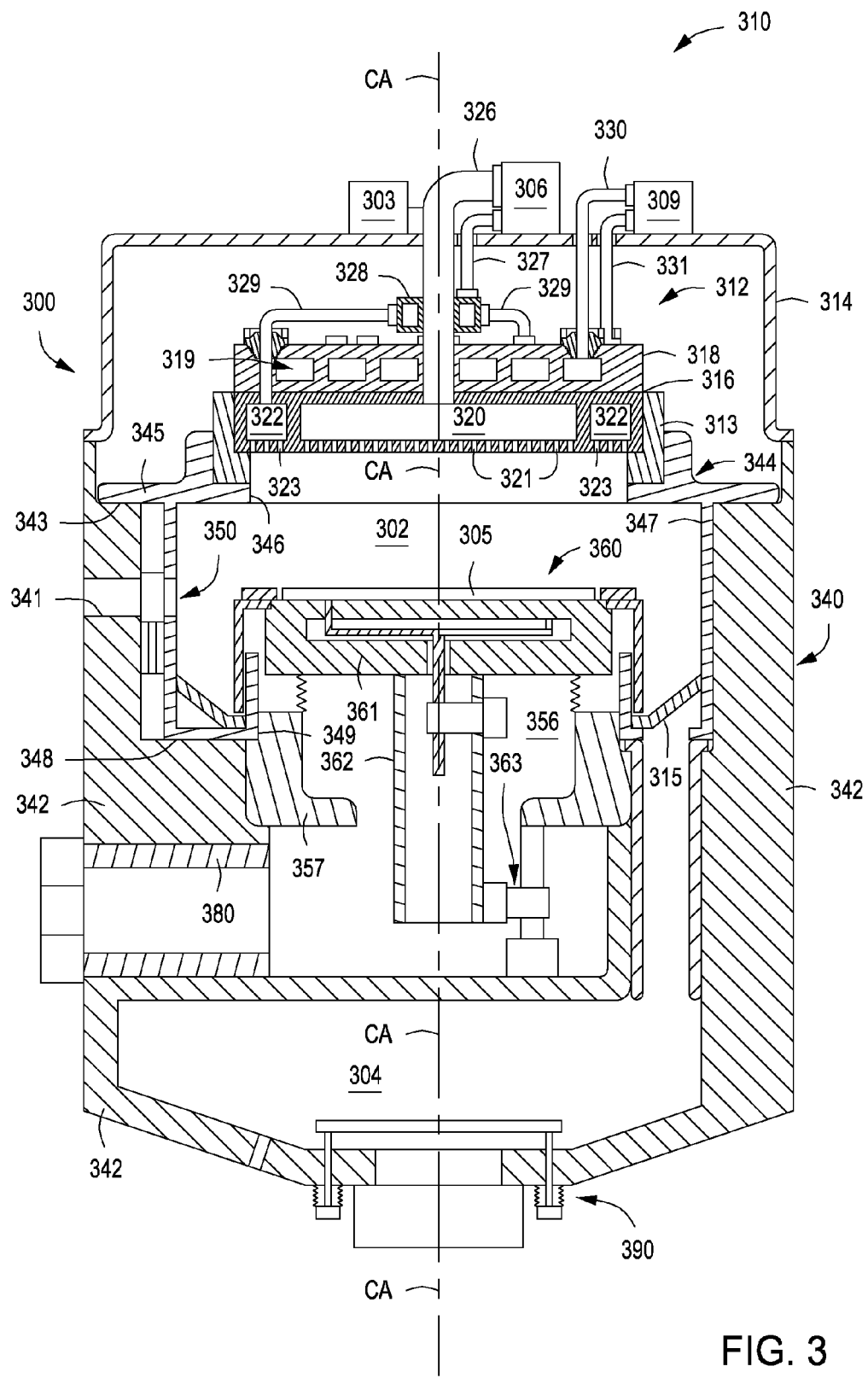
FIG. 3 depicts a schematic side view of a process chamber suitable for performing portions of the present disclosure.

FIG. 3 depicts a schematic diagram of an illustrative plasma process chamber 300 of the kind that may be used to practice embodiments of the disclosure as discussed herein. The plasma process chamber 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif.

The plasma process chamber 300 may be a plasma etch chamber, a plasma enhanced chemical vapor deposition chamber, a physical vapor deposition chamber, a plasma treatment chamber, an ion implantation chamber, or other suitable vacuum processing chamber. The plasma process chamber 300 generally includes a chamber lid assembly 310, a chamber body assembly 340, and an exhaust assembly 390, which collectively enclose a processing region 302 and an evacuation region 304. In practice, processing gases are introduced into the processing region 302 and ignited into a plasma using RF power. A substrate 305 is positioned on a substrate support assembly 360 and exposed to the plasma generated in the processing region 302 to perform a plasma process on the substrate 305, such as etching, chemical vapor deposition, physical vapor deposition, implantation, plasma annealing, plasma treating, abatement, or other plasma processes. Vacuum is maintained in the processing region 302 by the exhaust assembly 390, which removes spent processing gases and byproducts from the plasma process through the evacuation region 304.

The chamber lid assembly 310 generally includes an upper electrode 312 (or anode) isolated from and supported by the chamber body assembly 340 and a chamber lid 314 enclosing the upper electrode 312. The upper electrode 312 is coupled to an RF power source 303 via a conductive gas inlet tube 326. The conductive gas inlet tube 326 is coaxial with a central axis (CA) of the chamber body assembly 340 so that both RF power and processing gases are symmetrically provided. The upper electrode 312 includes a showerhead plate 316 attached to a heat transfer plate 318.

The showerhead plate 316 has a central manifold 320 and one or more outer manifolds 322. The one or more outer manifolds 322 circumscribe the central manifold 320. The central manifold 320 receives processing gases from a gas source 306 through the conductive gas inlet tube 326 and distributes the received processing gases into a central portion of the processing region 302 through a plurality of gas passages 321. The outer manifold(s) 322 receives processing gases, which may be the same or a different mixture of gases received in the central manifold 320, from the gas source 306. The outer manifold(s) 322 then distributes the received processing gases into an outer portion of the processing region 302 through a plurality of gas passages 323. The central and outer manifolds 320, 322 have sufficient volume to function as a plenum so that uniform pressure is provided to each gas passage 321 associated with a respective central or outer manifold 320, 322.

A processing gas from the gas source 306 is delivered through an inlet tube 327 into a ring manifold 328 concentrically disposed around the conductive gas inlet tube 326. From the ring manifold 328, the processing gas is delivered through a plurality of gas tubes 329 to the outer manifold(s) 322. In one embodiment, the ring manifold 328 includes a recursive gas path to assure that gas flows equally from the ring manifold 328 into the gas tubes 329.

A heat transfer fluid is delivered from a fluid source 309 to the heat transfer plate 318 through a fluid inlet tube 330. The fluid is circulated through one or more fluid channels 319 disposed in the heat transfer plate 318 and returned to the fluid source 309 via a fluid outlet tube 331.

The chamber body assembly 340 includes a chamber body 342. The substrate support assembly 360 is centrally disposed within the chamber body 342 and positioned to support the substrate 305 in the processing region 302 symmetrically about the central axis (CA).

An upper liner assembly 344 is disposed within an upper portion of the chamber body 342 circumscribing the processing region 302. The upper liner assembly 344 shields the upper portion of the chamber body 342 from the plasma in the processing region 302 and is removable to allow periodic cleaning and maintenance. In one embodiment, the upper liner assembly 344 is temperature controlled, such as by an AC heater (not shown) in order to enhance the thermal symmetry within the chamber and symmetry of the plasma provided in the processing region 302.

The chamber body 342 includes a ledge 343 that supports an outer flange 345 of the upper liner assembly 344. An inner flange 346 of the upper liner assembly 344 supports the upper electrode 312. An insulator 313 is positioned between the upper liner assembly 344 and the upper electrode 312 to provide electrical insulation between the chamber body assembly 340 and the upper electrode 312.

The upper liner assembly 344 includes an outer wall 347 attached to the inner and outer flanges (346,345), a bottom wall 348, and an inner wall 349. The outer wall 347 and inner wall 349 are substantially vertical, cylindrical walls. The outer wall 347 is positioned to shield chamber body 342 from plasma in the processing region 302, and the inner wall 349 is positioned to at least partially shield the side of the substrate support assembly 360 from plasma in the processing region 302. The bottom wall 348 joins the inner and outer walls (349, 347).

The processing region 302 is accessed through a slit valve tunnel 341 disposed in the chamber body 342 that allows entry and removal of the substrate 305 into/from the substrate support assembly 360. The upper liner assembly 344 has a slot 350 disposed therethrough that matches the slit valve tunnel 341 to allow passage of the substrate 305 therethrough.

The substrate support assembly 360 generally includes lower electrode 361 (or cathode) and a hollow pedestal 362, the center of which the central axis (CA) passes through, and is supported by a central support member 357 disposed in the central region 356 and supported by the chamber body 342. The central axis (CA) also passes through the center of the central support member 357. The lower electrode 361 is coupled to the RF power source 303 through a matching network (not shown) and a cable (not shown) routed through the hollow pedestal 362. When RF power is supplied to the upper electrode 312 and the lower electrode 361, an electrical field formed therebetween ignites the processing gases present in the processing region 302 into a plasma.

The central region 356 is sealed from the processing region 302 and may be maintained at atmospheric pressure, while the processing region 302 is maintained at vacuum conditions.

An actuation assembly 363 is positioned within the central region 356 and attached to the chamber body 342 and/or the central support member 357 to raises or lowers the hollow pedestal 362. Since the lower electrode 361 is supported by the hollow pedestal 362, the actuation assembly 363 provides vertical movement of the lower electrode 361 relative to the chamber body 342, the central support member 357, and the upper electrode 312. In addition, since the substrate 305 is supported by the lower electrode 361, the gap between the substrate 305 and the showerhead plate 316 may also be varied, resulting in greater control of the process gas distribution across the substrate 305.

In one embodiment, the lower electrode 361 is an electrostatic chuck, and thus includes one or more electrodes (not shown). A voltage source (not shown) biases the one or more electrodes with respect to the substrate 305 to create an attraction force to hold the substrate 305 in position during processing. Cabling coupling the one or more electrodes to the voltage source is routed through the hollow pedestal 362 and out of the chamber body 342 through one of the plurality of access tubes 380.

A conductive, slant mesh liner 315 is positioned in a lower portion of the upper liner assembly 344. The slant mesh liner 315 may have a plurality of apertures formed there through to allow exhaust gases to be drawn uniformly therethrough, which in turn, facilitates uniform plasma formation in the processing region 302 and allows greater control of the plasma density and gas flow in the processing region 302.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of processing a substrate, comprising:
   depositing an oxide material on a substrate having a first region, a second region and a plurality of features, wherein the first region has a high feature density and the second region has a low feature density; and
   controlling a ratio of an etch rate of the oxide material in the first region to an etch rate of the oxide material in the second region by forming an ammonium hexafluorosilicate $((NH_4)_2SiF_6)$ layer having a first thickness atop the oxide material in the first region and having a second thickness atop the oxide material in the second region, wherein the first thickness is different than the second thickness.

2. The method of claim 1, wherein the first thickness of the ammonium hexafluorosilicate $((NH_4)_2SiF_6)$ layer in the first region is less than the second thickness of the ammonium hexafluorosilicate $((NH_4)_2SiF_6)$ layer in the second region.

3. The method of claim 2, wherein the etch rate of the oxide material in the first region is greater than the etch rate of the oxide material in the second region.

4. The method of claim 1, wherein the first thickness of the ammonium hexafluorosilicate $((NH_4)_2SiF_6)$ layer in the first region is greater than the second thickness of the ammonium hexafluorosilicate $((NH_4)_2SiF_6)$ layer in the second region.

5. The method of claim 4, wherein the etch rate of the oxide material in the second region is greater than the etch rate of the oxide material in the first region.

6. The method of claim 1, wherein forming an ammonium hexafluorosilicate $((NH_4)_2SiF_6)$ layer further comprises exposing the substrate to a plasma formed from a first process gas, wherein the first process gas forms an ammonium fluoride $(NH_4F)$ to react with the oxide material.

7. The method of claim 6, further comprising maintaining the substrate at a first temperature of less than about 50 degrees Celsius to promote reaction of the ammonium fluoride $(NH_4F)$ with the oxide material.

8. The method of claim 6, further comprising forming the plasma by applying a source power of greater than about 45 watts.

9. The method of claim 6, further comprising forming the ammonium hexafluorosilicate $((NH_4)_2SiF_6)$ layer at a pressure of about 1 to about 5 Torr.

10. The method of claim 6, wherein the first process gas comprises ammonia $(NH_3)$ and nitrogen trifluoride $(NF_3)$.

11. The method of claim 10, wherein the first process gas further comprises an inert gas.

12. The method of claim 11, wherein the inert gas is one or more of argon, helium, xenon, or krypton.

13. The method of claim 12, wherein the inert gas is provided at flow rate of about 600 sccm to about 1200 sccm.

14. The method of claim 13, wherein a ratio of the inert gas to ammonia $(NH_3)$ and nitrogen trifluoride $(NF_3)$ in the first process gas is about 3:1 to about 6:1.

15. A method of processing a substrate, comprising:
   depositing an oxide material on a substrate having a first region, a second region and a plurality of features, wherein the first region has a high feature density and the second region has a low feature density;

controlling a ratio of an etch rate of the oxide material in the first region to an etch rate of the oxide material in the second region by forming an ammonium hexafluorosilicate $((NH_4)_2SiF_6)$ layer having a first thickness atop the oxide material in the first region and having a second thickness atop the oxide material in the second region, wherein the first thickness is different than the second thickness; and heating the substrate to a temperature to sublimate the ammonium hexafluorosilicate $((NH_4)_2SiF_6)$ layer.

16. The method of claim 15, wherein the temperature is greater than about 100 degrees Celsius to sublimate the ammonium hexafluorosilicate $((NH_4)_2SiF_6)$ layer.

17. A computer readable medium, having instructions stored thereon which, when executed, cause a process chamber to perform a method of processing a substrate, the method comprising:

depositing an oxide material on a substrate having a first region, a second region and a plurality of features, wherein the first region has a high feature density and the second region has a low feature density; and controlling a ratio of an etch rate of the oxide material in the first region to an etch rate of the oxide material in the second region by forming an ammonium hexafluorosilicate $((NH_4)_2SiF_6)$ layer having a first thickness atop the oxide material in the first region and having a second thickness atop the oxide material in the second region, wherein the first thickness is different than the second thickness.

18. The computer readable medium of claim 17, wherein the first thickness of the ammonium hexafluorosilicate $((NH_4)_2SiF_6)$ layer in the first region is less than the second thickness of the ammonium hexafluorosilicate $((NH_4)_2SiF_6)$ layer in the second region.

19. The computer readable medium of claim 17, wherein the first thickness of the ammonium hexafluorosilicate $((NH_4)_2SiF_6)$ layer in the first region is greater than the second thickness of the ammonium hexafluorosilicate $((NH_4)_2SiF_6)$ layer in the second region.

* * * * *